US008753964B2

(12) United States Patent
Bryant et al.

(10) Patent No.: US 8,753,964 B2
(45) Date of Patent: Jun. 17, 2014

(54) FINFET STRUCTURE HAVING FULLY SILICIDED FIN

(75) Inventors: Andres Bryant, Burlington, VT (US); Huiming Bu, Millwood, NY (US); Dechao Guo, Wappingers Falls, NY (US); Wilfried E. Haensch, Somers, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 13/015,123

(22) Filed: Jan. 27, 2011

(65) Prior Publication Data

US 2012/0193712 A1  Aug. 2, 2012

(51) Int. Cl.
H01L 29/786 (2006.01)

(52) U.S. Cl.
USPC ............... 438/586; 257/347; 257/E21.129; 257/E21.19

(58) Field of Classification Search
USPC .......................... 438/149, 667, 586
See application file for complete search history.

(56) References Cited

U.S. PATENT DOCUMENTS

| | | | |
|---|---|---|---|
| 6,933,183 B2 | 8/2005 | Beintner et al. | |
| 7,087,506 B2 | 8/2006 | Anderson et al. | |
| 7,241,649 B2 | 7/2007 | Donze et al. | |
| 7,329,913 B2 | 2/2008 | Brask et al. | |
| 7,646,046 B2 * | 1/2010 | Russ et al. | 257/288 |
| 7,667,271 B2 * | 2/2010 | Yu et al. | 257/347 |
| 7,691,690 B2 * | 4/2010 | Zhu et al. | 438/157 |
| 7,791,140 B2 * | 9/2010 | Van Dal et al. | 257/347 |
| 7,838,967 B2 * | 11/2010 | Chen | 257/621 |
| 7,898,041 B2 * | 3/2011 | Radosavljevic et al. | 257/401 |
| 8,084,330 B2 * | 12/2011 | Maszara | 438/302 |
| 2006/0166456 A1 * | 7/2006 | Fujiwara et al. | 438/399 |
| 2006/0177998 A1 | 8/2006 | Lin et al. | |
| 2007/0132009 A1 * | 6/2007 | Takeuchi et al. | 257/321 |
| 2007/0141798 A1 * | 6/2007 | Bohr | 438/301 |
| 2009/0007036 A1 * | 1/2009 | Cheng et al. | 716/5 |
| 2009/0014796 A1 * | 1/2009 | Liaw | 257/347 |
| 2009/0206404 A1 * | 8/2009 | Pillarisetty et al. | 257/365 |
| 2010/0117237 A1 | 5/2010 | Coolbaugh et al. | |
| 2010/0252799 A1 * | 10/2010 | Kakoschke et al. | 257/5 |
| 2010/0297844 A1 * | 11/2010 | Yelehanka et al. | 438/667 |

(Continued)

OTHER PUBLICATIONS

Rinus Tek Po Lee et al, "Sib-30 nm FinFETs with Schottky-Barrier Source/Drain Featuring Complementary Metall Silicides and Fully-Silicided Gate for P-FinFETs", Mater. Res. Soc. Symp. Proc. vol. 995, 2007, Material Research Society.

(Continued)

*Primary Examiner* — Stephen W Smoot
*Assistant Examiner* — Edward Chin
(74) *Attorney, Agent, or Firm* — Law Offices of Ira D. Blecker, P.C.

(57) ABSTRACT

A semiconductor device which includes fins of a semiconductor material formed on a semiconductor substrate and then a gate electrode formed over and in contact with the fins. An insulator layer is deposited over the gate electrode and the fins. A trench opening is then etched in the insulator layer. The trench opening exposes the fins and extends between the fins. The fins are then silicided through the trench opening. Then, the trench opening is filled with a metal in contact with the silicided fins to form a local interconnect connecting the fins.

12 Claims, 5 Drawing Sheets

(56) References Cited

U.S. PATENT DOCUMENTS

| | | | |
|---|---|---|---|
| 2011/0079855 A1* | 4/2011 | Chan et al. | 257/368 |
| 2011/0248326 A1* | 10/2011 | Kanakasabapathy et al. | 257/300 |
| 2011/0284967 A1* | 11/2011 | Cheng et al. | 257/368 |
| 2012/0119302 A1* | 5/2012 | Pei et al. | 257/382 |
| 2012/0139015 A1* | 6/2012 | Yu et al. | 257/288 |

OTHER PUBLICATIONS

Kiyoshi Okuyama, "Optimized Silicidation Techniques for Source and Drain of Fin-Type Field-Effect Transistor", Vol, 47, No. 4, 2008, pp. 2407-2409, The Japan Society of Applied Physics.

Prosecution History, PCT/US12/22264, International Search Report and Written Opinion, May 10, 2012

* cited by examiner

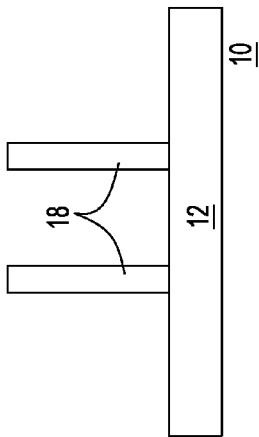
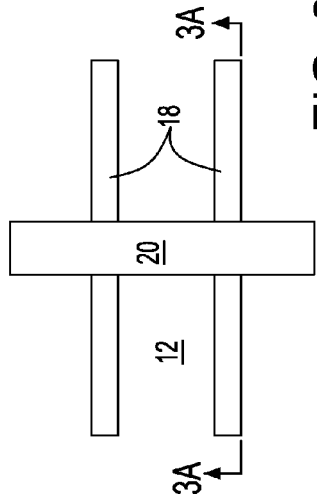
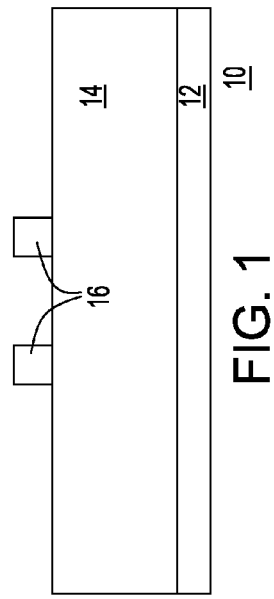
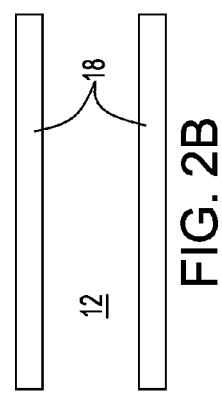
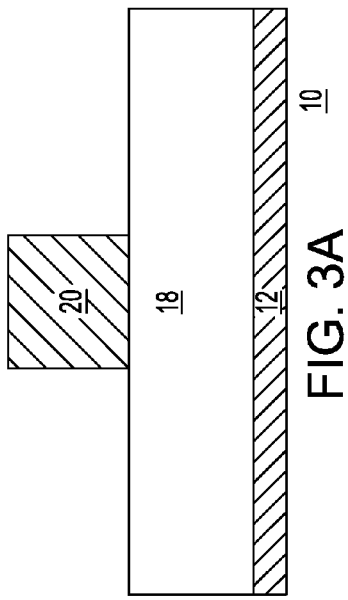

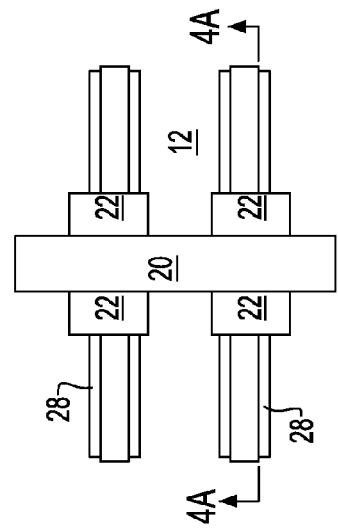
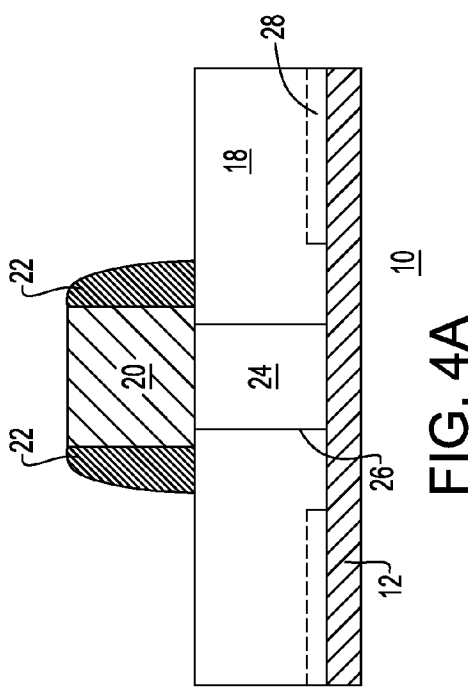
FIG. 4A
FIG. 4B
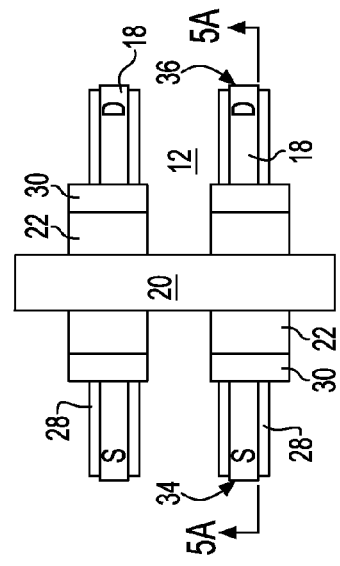
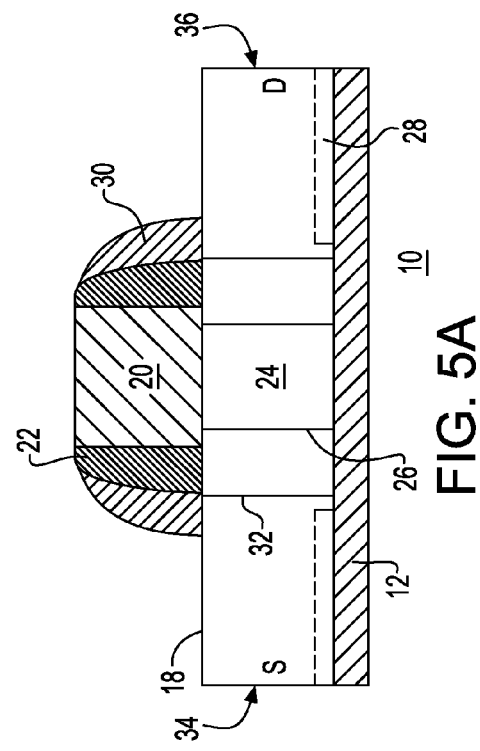
FIG. 5A
FIG. 5B

US 8,753,964 B2

FINFET STRUCTURE HAVING FULLY SILICIDED FIN

BACKGROUND

The present invention relates generally to FinFET semiconductor devices and, more particularly, to external resistance reduction in FinFET semiconductor devices.

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may also be fabricated using layout and process techniques similar to those used for conventional planar MOSFETs.

BRIEF SUMMARY

The various advantages and purposes of the exemplary embodiments as described above and hereafter are achieved by providing, according to a first aspect of the exemplary embodiments, a method of manufacturing a semiconductor device. The method includes forming a plurality of fins on a semiconductor substrate, the fins including a semiconductor material, forming a gate electrode over and in contact with each of the plurality of fins, depositing an insulator layer over the gate electrode and the plurality of fins, etching a trench opening in the insulator layer that exposes the plurality of fins and extends between the plurality of fins, siliciding the plurality of fins through the trench opening, and filling the trench opening with a metal in contact with the silicided fins to form a local interconnect connecting the plurality of fins.

According to a second aspect of the exemplary embodiments, there is provided a method of manufacturing a semiconductor device. The method includes forming a plurality of fins on a semiconductor substrate, the fins including a semiconductor material and having first and second side surfaces, forming a gate electrode over and in contact with each of the plurality of fins, forming spacers on the gate electrode, forming a spacer on the first and second side surfaces, the spacer covering only a portion of the first and second side surfaces adjacent the semiconductor substrate, depositing an insulator layer over the gate electrode and the plurality of fins, etching a trench opening in the insulator layer that exposes the plurality of fins and extends between the plurality of fins, siliciding the plurality of fins through the trench opening, the siliciding extending down to the spacer on the first and second side surfaces, and filling the trench opening with a metal in contact with the silicided fins to form a local interconnect connecting the plurality of fins.

According to a third aspect of the exemplary embodiments, there is provided a semiconductor device. The semiconductor device includes a semiconductor substrate having a plurality of fins, the fins including a semiconductor material, a gate electrode over and in contact with each of the plurality of fins, an insulator layer over the gate electrode and the plurality of fins, a trench opening in the insulator layer that exposes the plurality of fins and extends between the plurality of fins, the plurality of fins being silicided through the trench opening, and the trench opening filled with a metal in contact with the silicided fins to form a local interconnect connecting the plurality of fins.

According to a fourth aspect of the exemplary embodiments, there is provided a semiconductor device. The semiconductor device including a plurality of fins on a semiconductor substrate, the fins including a semiconductor material and having first and second side surfaces, a gate electrode over and in contact with each of the plurality of fins, spacers on the gate electrode, a spacer on the first and second side surfaces, the spacer covering only a portion of the first and second side surfaces adjacent the semiconductor substrate, an insulator layer over the gate electrode and the plurality of fins, a trench opening in the insulator layer that exposes the plurality of fins and extends between the plurality of fins, wherein the plurality of fins being silicided through the trench opening, the siliciding extending down to the spacer on the first and second side surfaces, and the trench opening filled with a metal in contact with the silicided fins to form a local interconnect connecting the plurality of fins.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments themselves, however, both as to organization and method of operation, may best be understood by reference to the detailed description which follows taken in conjunction with the accompanying drawings in which:

FIGS. 1 to 9B illustrate exemplary views of a FinFET semiconductor device fabricated according to exemplary embodiments of the invention wherein:

FIG. 1 illustrates a patterned photoresist mask on a silicon layer;

FIGS. 2A, 2B and 2C illustrate the formation of fins subsequent to the etching of the patterned silicon layer in FIG. 1;

FIGS. 3A and 3B illustrate the formation of a gate over the fins;

FIGS. 4A and 4B illustrate the formation of first spacers adjacent to the gate;

FIGS. 5A and 5B illustrate the formation of second spacers adjacent to the first spacers;

FIGS. 9A and 9B illustrate the filling of the trenches in the stress nitride layer with a metallic material.

DETAILED DESCRIPTION

Figure 6A:
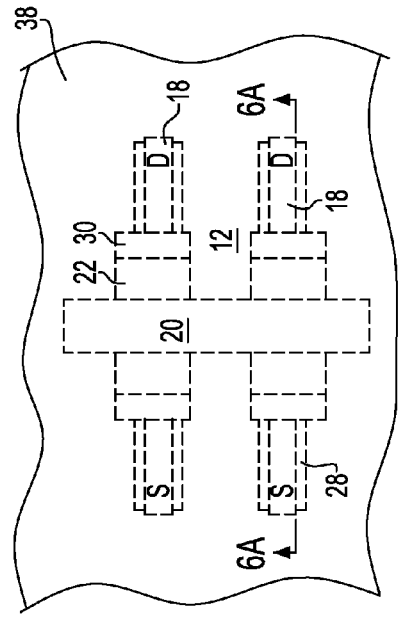
FIGS. 6A and 6B illustrate the formation of a stress nitride layer.

A FinFET is generally described as a nonplanar, double-gate semiconductor device built on a semiconductor substrate, typically a silicon-on-insulator (SOI) substrate. The conducting channel of a FinFET semiconductor device is wrapped around a thin semiconductor fin, typically comprising silicon, which forms the body of the semiconductor device. The dimensions of the fin determine the effective channel length of the semiconductor device.

Referring to the Figures in more detail, FIGS. 1 to 9B illustrate the formation of a FinFET semiconductor device according to exemplary embodiments. The fabrication of one FinFET semiconductor device will be described hereafter. It will be understood, however, that the techniques described herein are equally applicable to forming more than one FinFET semiconductor device.

As shown in FIG. 1, processing may begin by forming a silicon layer 14 on a semiconductor substrate. While bulk semiconductor may be used in the exemplary embodiments, it is preferred to use an SOI structure which may include a silicon substrate 10 and a buried oxide layer 12. Buried oxide layer 12 and silicon layer 14 may be formed on silicon substrate 10 in a conventional manner.

In an exemplary embodiment, buried oxide layer 12 may include a silicon oxide and silicon layer 14 may include monocrystalline or polycrystalline silicon. Silicon layer 14 is used to form a fin for a FinFET semiconductor device as described in more detail below. The thicknesses of buried oxide layer 12 and silicon layer 14 are conventional.

In alternative embodiments, substrate 10 and/or silicon layer 14 may comprise other semiconducting materials, including but not limited to group IV semiconductors such as silicon, silicon germanium or germanium, a III-V compound semiconductor, or a II-VI compound semiconductor. Buried oxide layer 12 may comprise other dielectric materials.

Still referring to FIG. 1, a photoresist material may be deposited and patterned to form a photoresist mask 16 for subsequent processing. The photoresist material may be deposited and patterned in any conventional manner. The width of the photoresist mask 16 should approximate the width of the fins formed by subsequent processing.

The semiconductor structure shown in FIG. 1 may be conventionally etched to form a fin structure. The portion of silicon layer 14 not located beneath photoresist mask 16 may be etched in a conventional manner with the etching terminating on buried oxide layer 12. To assist in the etching of silicon layer 14, there may be formed a protective layer such as a silicon nitride layer or silicon oxide layer (not shown). Such a protective layer forms a hard mask and is omitted for clarity as it is not important to the present exemplary embodiments.

Referring now to FIGS. 2A, 2B, 2C, there is shown the fins 18 formed subsequent to the etching described with respect to FIG. 1. FIG. 2A is a side view of fins 18 while FIG. 2B is a view looking down on fins 18 showing the tops of fins 18. FIG. 2C is a view of the fins 18 looking from the right of FIG. 2A and shows the fins 18 formed subsequent to the etching of the structure shown in FIG. 1. It can be seen that fins 18 are thin, planar structures extending from buried oxide layer 12.

Referring now to FIGS. 3A and 3B, a gate 20 is formed over and in contact with the fins 18. The gate 20 wraps around the fins 18 so that the gate 20 extends over the fins 18, down the sides of the fins 18 and between the fins 18. In an exemplary embodiment, the gate 20 may comprise a high k dielectric material in contact with fins 18, metal gate material in contact with the high k dielectric material and polysilicon material in contact with the metal gate material. The gate 20 may be formed by blanket depositing layers of high k dielectric material, metal gate material and polysilicon material and then defining the gate 20 by etching away the portions of the layers that are not needed for the gate 20. The etching may be done by reactive ion etching. The materials for gate 20 and the method for forming the gate 20 are conventional. For purposes of illustration and not limitation, the high k dielectric material may include but not be limited to nitride hafnium silicate, hafnium silicate, zirconium silicate, hafnium dioxide and zirconium dioxide. For purpose of illustration and not limitation, the metal gate materials may include but not be limited to metals such as tungsten, nickel, cobalt and copper; carbides such as titanium carbide, zirconium carbide, tantalum carbide and tungsten carbide; and nitrides such as titanium nitride and tantalum nitride.

In FIGS. 3A and 3B, and all of the remaining FIGS. 4A to 9B, the "A" view is a side view (also known as an elevation view) of the semiconductor structure while the "B" view is a top view (also known as a plan view) of the semiconductor structure. The "A" view is taken in the direction of the A-A arrows shown in FIGS. 3B, 4B, 5B, 6B, 7B, 8B and 9B. Parts of the "A" views will be in cross-section.

Referring now to FIGS. 4A and 413, an insulating material, such as silicon nitride is deposited, defined and then reactive ion etched to form spacers 22. Spacers 22 extend over and along the sides of the fins 18 as does the gate 20. The spacers 22 need not extend into the space between fins 18 other than along the sides of the fins 18. A shallow extension junction implant is performed to dope the channel 24 beneath the spacers 22. The implants are done by tilt angle implanting at an angle of about 7 degrees to result in shallow junction edge 26. Tilt angle implanting is preferred so that the implants can proceed under the spacers 22 and into the channel 24. The implants may include but not be limited to arsenic, boron, phosphorus, $BF_2$, etc.

In an alternative exemplary embodiment, spacers 28 may be formed alongside and generally parallel to the bottom portion of the fins 18 adjacent the buried oxide layer 12. The spacers 28 may be on both sides of the fins 18 as is evident from FIG. 4B. The spacers 28 shown in FIG. 4A are on the back side of the fin 28 so they are shown in phantom. Spacers 28 may be formed during the same step that the spacers 22 are formed. That is, the insulating material such as silicon nitride is deposited and reactive ion etched to form spacers 22. The insulating material in one exemplary embodiment is removed everywhere except adjacent to the fins 18 and gate 20 as shown in FIGS. 4A and 4B. In the alternative exemplary embodiment, the reactive ion etching is stopped before all of the insulating material alongside the fins 18 is completely removed, resulting in spacers 28.

In a next step, a second set of spacers is formed as shown in FIGS. 5A and 5B. An insulating material, such as silicon nitride is deposited, defined and reactive ion etched to result in spacers 30. Spacers 30 extend over and along the sides of the fins 18 as does the gate 20. The spacers 30 need not extend into the space between fins 18 other than along the sides of the fins 18. Implants are then done for the source and drain at zero degrees. The implants may include but not be limited to arsenic, boron, phosphorus, $BF_2$, etc. After source and drain implants, the semiconductor structure undergoes a rapid thermal anneal heat treatment at about 1000° C. followed by a short millisecond laser anneal at about 1250° C. to activate the dopants. As a result, source/drain junction edge 32 is formed. One end of the fins 18 becomes the source (denoted by an "S"), for example end 34, and the other end of the fins 18 becomes the drain (denoted by a "D"), for example end 36. For all of the fins 18 in a given FinFET, the source should be on the same end of the fins 18 and the drain should be on the same end of the fins 18 as shown in FIG. 5B. Then, a local interconnect may connect all of the sources and another local interconnect may connect all of the drains. These local interconnects will be described in more detail hereafter.

Figure 6B:
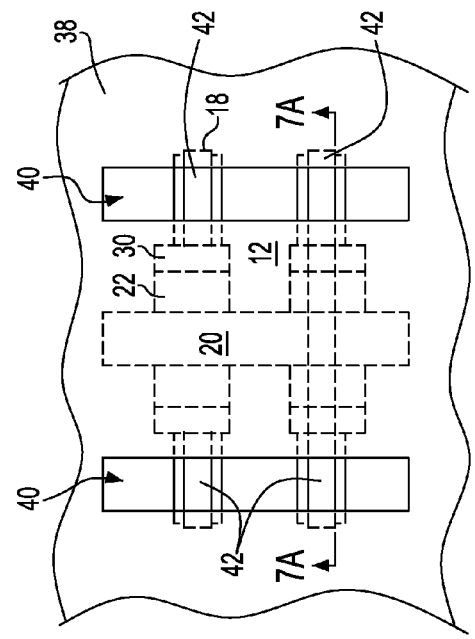

In a next step an insulating stress nitride layer 38, for example silicon nitride, is deposited over the entire semiconductor structure by conventional means as shown in FIGS. 6A and 6B. The stress nitride layer 38 may be about 30 nm thick. The stress nitride layer 38 imposes a tensile or compressive stress on the underlying semiconductor structure.

Figure 7A:
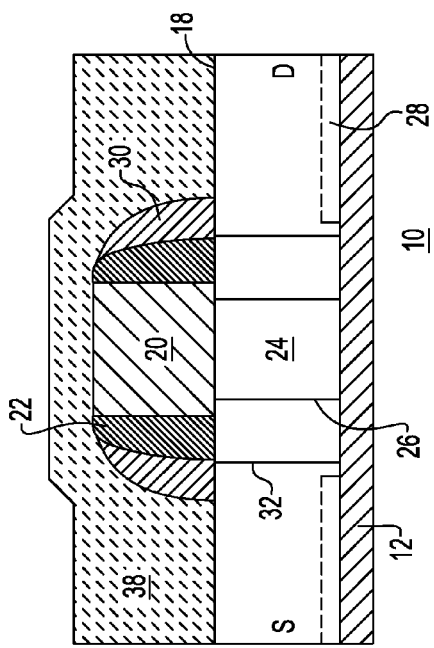
FIGS. 7A and 7B illustrate the formation of trenches in the stress nitride layer.
Figure 7B:
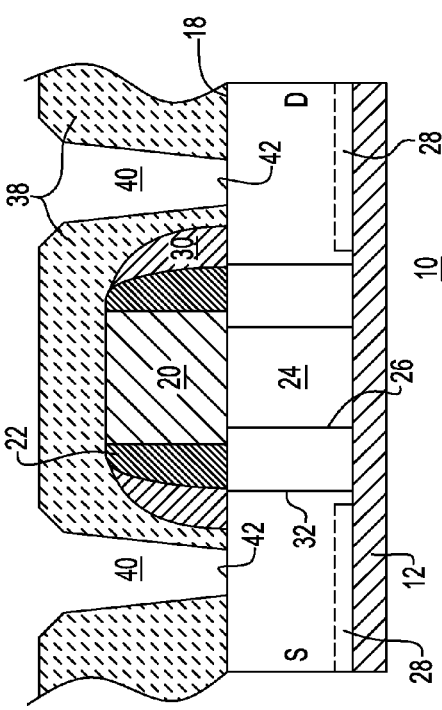

Referring now to FIGS. 7A and 7B, trenches 40 are formed in the stress nitride layer 38. The trenches 40 extend down to the top 42 of the fins 18, as best shown in FIG. 7A, and continue across all of the fins 18, as best shown in FIG. 7B. When the trenches 40 are formed, the sides of the tins 18 are exposed as well as the tops 42 of the fins 18. Between the fins 18, the trench 40 may expose the box layer 12.

Figure 8A:
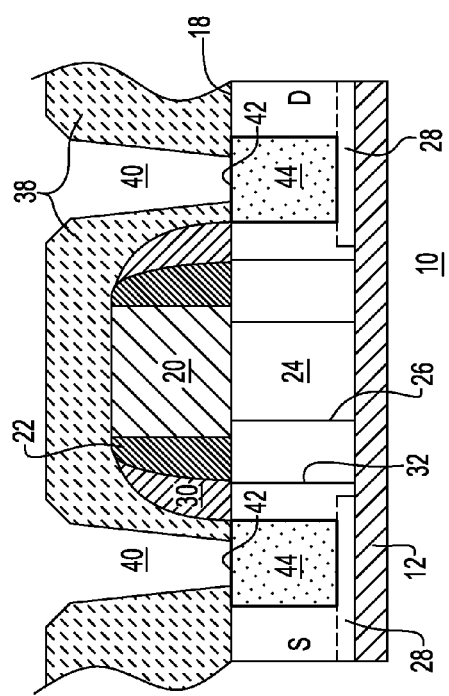
FIGS. 8A and 8B illustrate the siliciding of the fins.
Figure 8B:
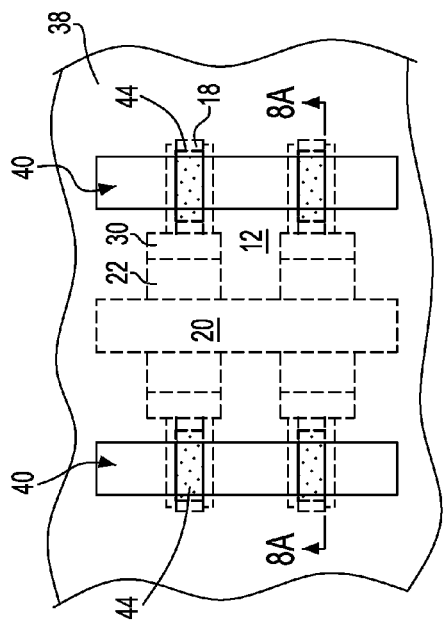

Referring now to FIGS. 8A and 8B, the fins 18 are silicided as indicated by the shaded area. The siliciding may occur by first precleaning the fins 18, and then sputtering about 4 nanometers of nickel or cobalt into the trenches 40, followed by a high temperature anneal at about 400° C. for about 30 seconds which causes the metal to react with the silicon in the fins 18 to form a silicide. Preferably, the fins 18 are fully silicided, also referred to as FUSI. Fully siliciding of the fins 18 is preferred for better process control.

In the exemplary embodiment that includes spacers 28 on the sidewalls of the fins 18, the siliciding only extends down to the spacers 28. By extending the siliciding only down to the spacers 28, increased contact area may be obtained.

Figure 9A:
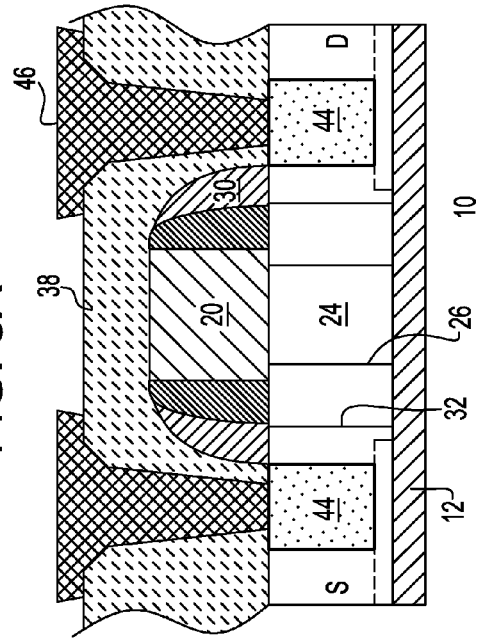
Figure 9B:
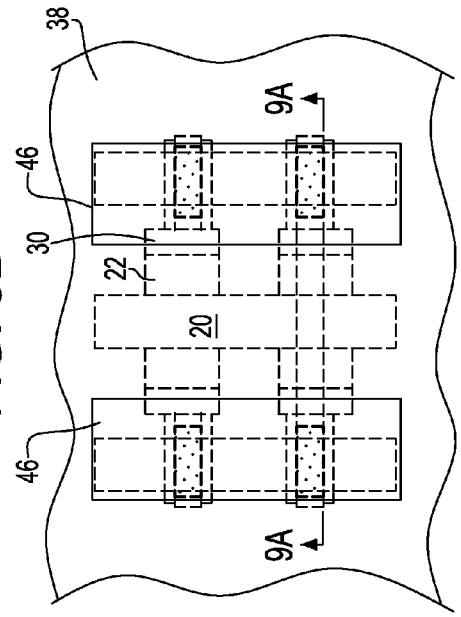

In the next step as shown in FIGS. 9A and 9B, copper 46 (preferably) is plated within trenches 40 to form a local interconnect between the sources and drains of fins 18. Prior to plating the copper 46 in the trenches, a barrier layer such as tantalum/tantalum nitride or ruthenium is preferably deposited, for example, by chemical vapor deposition, to line the trenches 40. The barrier layer, if any, is not shown in the Figures for clarity.

In a subsequent process, the copper 46 may then be planarized down to the level of the nitride layer 38 by a process such as chemical mechanical processing.

Processing of the semiconductor structures then continues with further integrated circuit formation processing and back end of the line processing to form completed semiconductor devices.

Figure 10:
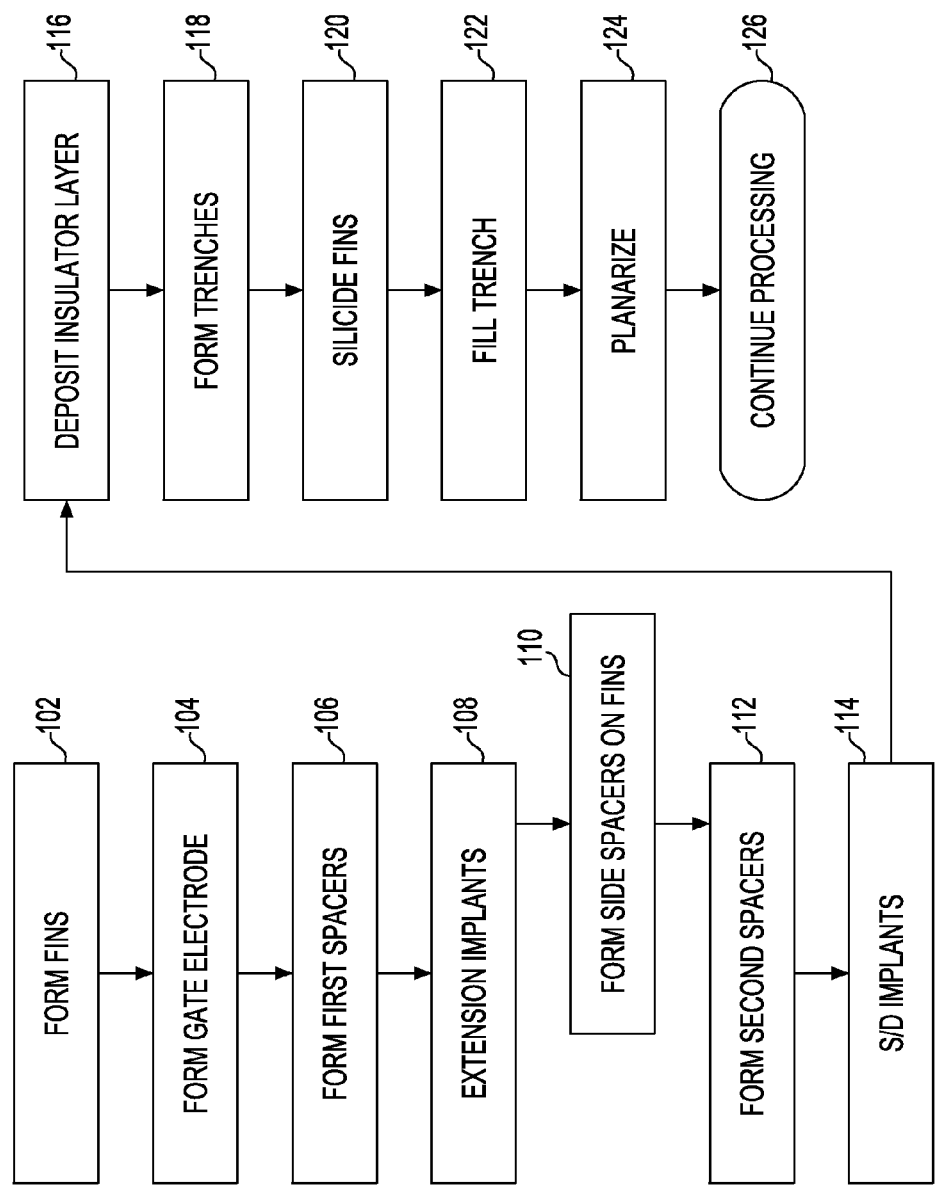
FIG. 10 illustrates an exemplary process for forming a FinFET semiconductor device according to the processing described in FIGS. 1 to 9B.

Referring now to FIG. 10, exemplary embodiments of the method will be discussed. The processing begins by forming the fins, block 102, then forming the gate electrode, block 104. First spacers are formed for the gate electrode, block 106, and then an extension implant is performed to dope the channel underneath the spacers 22, block 108. In an alternative exemplary embodiment, spacers may be formed on the sides of the fins, block 110. Processing of the exemplary embodiment continues in which second spacers are formed, block 112, followed by source and drain implants in the fins, block 114. A stress nitride insulator layer is deposited, block 116, and then trenches are formed between the sources and drains of the fins, block 118. The fins are then silicided, preferably fully silicided, block 120. The trenches are filled with copper (preferably), block 122, and then the copper is planarized down to the stress nitride layer, block 124. Processing then continues in a normal way, block 126.

External resistance reduction is of utmost important for the deployment of an SOI FinNFET device due to the nature of the ultra-thin silicon substrate. Because of the 3-D Fin structure, junction profile/silicide formation favors the planar topology. It is critical to obtain the drive current contribution from the bottom portion of the Fin, while at the same time reduce the current crowding effect. The exemplary embodiments utilize the preferred fully-silicided Fin process to increase the exposed area for the carrier draining. The exemplary embodiments also use the trench silicide process to limit the silicide encroachment to the source/drain junction. By limiting the spacer pull-down at the Fin sidewall, the remaining nitride protects the bottom portion of the Fin from silicidation. Thus the contact area can be further enlarged. The integration scheme of the exemplary embodiments is also compatible with the gate-last high-k/metal gate process flow.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of manufacturing a semiconductor device comprising the steps of:
    forming a plurality of fins on a semiconductor substrate, the fins comprising a semiconductor material and having first and second side surfaces, the first and second side surfaces having a bottom portion adjacent to the semiconductor substrate;
    forming a gate electrode over and in contact with each of the plurality of fins;
    forming first spacers on the gate electrode;
    forming a second spacer only on the first and second side surfaces, the second spacer being parallel to and covering only the bottom portion of the first and second side surfaces adjacent the semiconductor substrate;
    after forming the second spacer, depositing an insulator layer over the gate electrode and the plurality of fins;
    etching a trench opening in the insulator layer that exposes the plurality of fins and extends between the plurality of fins;
    siliciding the plurality of fins through the trench opening, the siliciding extending down to the second spacer on the first and second side surfaces such that the siliciding is spaced from the semiconductor substrate by the second spacer; and
    filling the trench opening with a metal in contact with the silicided fins to form a local interconnect connecting the plurality of fins.

2. The method of claim 1 wherein the siliciding is fully siliciding.

3. The method of claim 1 wherein the step of siliciding comprises depositing a layer of metal on the fins and then heating the fins and metal to cause the formation of a metal silicide.

4. The method of claim 1 wherein the fins comprise silicon.

5. The method of claim 1 wherein the insulator layer is a stress nitride layer.

6. The method of claim 1 wherein the metal filling the trench opening is copper.

7. The method of claim 1 wherein the semiconductor substrate is a silicon on insulator semiconductor substrate.

8. A semiconductor device comprising:
a plurality of fins on a semiconductor substrate, the fins comprising a semiconductor material and having first and second side surfaces, the first and second side surfaces having a bottom portion adjacent to the semiconductor substrate;
a gate electrode over and in contact with each of the plurality of fins;
first spacers on the gate electrode;
a second spacer only on the first and second side surfaces and not being formed on a top of the fins, the second spacer being parallel to and covering only the bottom portion of the first and second side surfaces adjacent the semiconductor substrate;
an insulator layer separate from the second spacer over the gate electrode and the plurality of fins;
a trench opening in the insulator layer that exposes the plurality of fins and extends between the plurality of fins, wherein the plurality of fins being silicided through the trench opening, the siliciding extending down to the second spacer on the first and second side surfaces such that the siliciding is spaced from the semiconductor substrate by the second spacer; and
the trench opening filled with a metal in contact with the silicided fins to form a local interconnect connecting the plurality of fins.

9. The semiconductor device of claim 8 wherein the plurality of fins being fully silicided through the trench opening.

10. The semiconductor device of claim 8 wherein the insulator layer is a stress nitride layer.

11. The semiconductor device of claim 8 wherein the metal filled in the trench opening is copper.

12. The semiconductor device of claim 8 wherein the semiconductor substrate is a silicon on insulator semiconductor substrate.

* * * * *